United States Patent [19]
Resnikoff

[11] Patent Number: 5,359,627
[45] Date of Patent: * Oct. 25, 1994

[54] CHANNEL CODEC APPARATUS AND METHOD UTILIZING FLAT CODES

[75] Inventor: Howard L. Resnikoff, Wincester, Mass.

[73] Assignee: Aware, Inc., Cambridge, Mass.

[*] Notice: The portion of the term of this patent subsequent to Jan. 14, 2009 has been disclaimed.

[21] Appl. No.: 86,198

[22] Filed: Jul. 1, 1993

Related U.S. Application Data

[63] Continuation of Ser. No. 679,642, Apr. 2, 1991, abandoned.

[51] Int. Cl.$^5$ .............................................. H04B 1/10
[52] U.S. Cl. ........................................ 375/34; 375/96; 370/21
[58] Field of Search .................. 375/34.1, 80, 94, 96; 370/19, 21

[56] References Cited

U.S. PATENT DOCUMENTS

5,081,645  1/1992  Resnikoff .............................. 375/96

Primary Examiner—Stephen Chin
Assistant Examiner—T. Ghebretinsae
Attorney, Agent, or Firm—McCubbrey, Bartels & Ward

[57] ABSTRACT

A channel coding system comprising apparatuses and methods for encoding and decoding signals is disclosed. The system utilizes an orthonormal basis of numerical sequences for coding an input signal. The orthonormal bases reduce channel interference. A method for generating long basis sequences from the product of shorter sequences is also disclosed.

8 Claims, 4 Drawing Sheets

CHANNEL CODEC APPARATUS AND METHOD UTILIZING FLAT CODES

This application is a continuation, of application Ser. No. 07/679,642, filed Apr. 2, 1991, now abandoned.

FIELD OF THE INVENTION

The present invention relates to communication systems and, more particularly, to systems which utilize channel coding techniques.

BACKGROUND OF THE INVENTION

Channel coding provides significant improvements in communication systems which must operate in noisy environments. Consider a simple digital communication system in which messages consisting of sequences of bits are sent from a transmitter to a receiver. The transmission typically involves modulating a carrier signal with a waveform which specifies the value of the bit being sent. The output of the transmitter for a single bit will be referred to as the bit signal in the following discussion. In a binary transmission system, there are two such bit signals, one representing zero and the other representing one.

Upon reaching the receiver, the detected bit signals are compared with those corresponding to one and zero to recover each bit in the sequence. In a noisy environment, any bit signal may be corrupted by a noise pulse in its journey from the transmitter to the receiver. The probability of such a corruption is related to the statistical distribution of the noise pulses. In particular, it is related to the probability of finding a noise pulse which will add sufficient energy to the bit signal during transmission to corrupt that bit in a manner that will cause the receiver to mis-identify the bit signal.

It should be noted that the addition of a constant amount of energy to each bit signal need not cause corruption of the signal, as the receiver could compensate by subtracting a constant from each detected bit signal. Hence, the corruption results from adding different amounts of noise energy to different bit signals. The variation in the amount of energy added to each bit signal will depend on the duration of the bit signals. If the bit signals are long compared to the duration of the noise pulses, then the energy added to any given bit signal will be the average of the energies in a large number of noise pulses. Such an average will be relatively constant from bit signal to bit signal. If, however, the duration of the bit signals is of the same order as that of the noise pulses, the variation in added noise energy from bit signal to bit signal will be relatively large. Hence, it is advantageous to use relatively long bit signals.

If the bit signals do not overlap in time, such a strategy would result in a very low transmission bit rate on the communication channel. Such a reduction in transmission rate is generally to be avoided. Hence, a system in which the bit signals corresponding to adjacent bits in the message must overlap is desirable. The resultant transmission at any given time is the sum of the bit signals from a large number of bits.

The manner in which channel coding systems operate can be more easily understood with reference to a simple system for sending a message consisting of binary data over a communication channel. In this system, the bits of the message are replaced by bit signals which are then used to modulate a carrier. The bit signal for zero corresponds to the modulating sequence G[0,i] for i=0 ... L-1, and the bit signal for one corresponds to the modulating sequence G[1,i] for i=0 ... L-1. In the following discussion, "L" is generally used for the number of elements in the bit signal. A message comprising the sequence of bits b(j) is to be transmitted. It is assumed that the transmitter and receiver are clocked at a predetermined rate and that one message bit is introduced into the apparatus on each clock pulse. The transmitter includes L shift registers, each of length L. When a bit is to be transmitted, the appropriate bit signal is loaded into the next free shift register. On each clock pulse, all of the shift registers are shifted once, and the data which is shifted off of the end of each shift register is added to form the transmitted signal. The signal will then be a sequence $\sigma(k)$, where k denotes the clock pulse and $$\sigma(k) = \sum_{j=0}^{L-1} G[b(j), k - j] \qquad (1)$$

Here, G[p,i] is defined to be zero for $i<0$ or $i>(L-1)$. In the absence of noise, the bits b(j) can be recovered at the receiver by circuitry that implements some method for solving an L×L system of linear equations. However, the computational workload involved makes this approach impractical for long waveforms.

If, however, the bit signals are orthogonal, the matrix representing the system of linear equations is diagonal, and the bits can be recovered by computing the correlation of the signal $\sigma(k)$ with the sequences G[1,i] and G[0,i]. If a bit having a value of B was sent starting at time K, then the correlation function $$C_b = \sum_{j=0}^{L-1} G[b,i]\sigma(K + L - i) \qquad (2)$$

should be one for b=B and zero otherwise. It should be noted that the orthogonality requirement restricts the manner in which the message is sent. In particular, it can be shown that no finite sequence G[b,i] is orthogonal to itself shifted by an arbitrary integer, i.e., by an arbitrary multiple of a 1-unit shift. Hence, if orthogonal sequences are utilized, the data bits can, at most, be introduced into the transmitter on every other clock pulse.

Orthonormal bit signals have the additional advantageous property of being more immune to burst noise for a given length waveform. If non-orthonormal signals are used and $\sigma(k)$ is corrupted by a burst of noise at some time K, sufficient information may be lost to prevent correct demodulation of the signal to recover the message bits. If, however, orthonormal bit signals are utilized, the effect of the noise is to lower the correlation value for the correct bit value and increase the correlation for the incorrect bit value. Hence, provided the noise is not sufficient to make the correlation values corresponding to different bits indistinguishable, the signal can be recovered even in the presence of burst noise. Hence, orthonormal bit signals are preferred.

In addition to orthonormality, it is advantageous to utilize bit signals which have the property that the sum signal $\sigma(k)$ is statistically indistinguishable from the noise to within some tolerance. It can be shown that this requirement allows the system to utilize a greater fraction of the bandwidth of a noise channel for communication (C. Shannon "Communications theory of secrecy systems", *Bell Systems Tech. Journal,* 28 pp. 676–715, 1949).

This last property also provides a means for embedding a channel coded signal in the noise in a communication channel being used for other purposes. In addition to providing security for the information being transmitted, such a system may also be used to multiplex communications. For example, a channel coding system satisfying this condition could be used to send digital data on top of voice data in a telecommunication system. The digital data would merely appear as low power random noise. The extent to which background interference is found to be objectionable to human listeners depends greatly on the form of the interference. In particular, human listeners are less sensitive to random noise than to noise having a regular pattern. Hence, a significantly higher signal power may be used for the digital communication if the coded signal is indistinguishable from the typical static encountered on telephone lines.

While the basic features for such a system have been known for some time, no practical system meeting all of the conditions has been provided in the prior art. For example, Shannon proposed using two long sequences, $G_0$ and $G_1$, for the bit signals in which each sequence consists of numbers having a Gaussian pseudorandom distribution. It may be shown that two infinitely long random sequences are statistically orthonormal; however, pseudorandom sequences of finite length are not orthonormal in general.

Unfortunately, this suggested method has a number of problems. It should be noted that it is advantageous to be able to vary the length of the bit signals in response to the noise environment. When used to provide a reduction in noise errors, there is an optimal length for the bit signals. The computational load inherent in the correlation operation for decoding the signal at the receiver is related to the length of the bit signal. Hence, shorter bit signals are preferred. On the other hand, the ability to withstand noise interference improves with the length of the bit signal. However, there is a point at which doubling the length of the bit sequences results in only a small improvement in interference rejection. For example, if burst noise is the limiting characteristic of a communication channel, and if the bit signal is much longer in time than the average noise pulse, very little additional improvement is obtained by further increasing the size of the bit signal, For given channel characteristics, the amount of information that can be sent over the channel depends on the length of the bit signal and specific values in the sequences. Before the signal $\sigma(k)$ can be decoded, it must be digitized at the receiver. For any given channel, there is a minimum signal variation that can be detected. The ratio of the maximum signal that can be accommodated in the channel to this minimum detectable signal variation will be referred to as the dynamic range of the channel. If the signal $\sigma(k)$ requires a greater dynamic range than the channel can accommodate, the signal will be clipped. Clipping can result in the loss of information.

Consider a system in which $\sigma(k)$ is used to modulate the amplitude of the carrier. As will be discussed in more detail below, the minimum dynamic range needed to accurately represent $\sigma(k)$ depends on the length of bit signals and the range of values contained in each bit signal. It can be seen from Eq. (1) that the dynamic range of $\sigma(k)$ depends on the dynamic range of the sequences $G_0$ and $G_1$, since the signal is itself a sum of values from these signals. In addition, the number of values to be combined depends on the length of the sequences. As the length of the sequences increases, the number of values to be combined, and hence, the required dynamic range, increases if data bits are to be sent in each available time interval. Hence, it is advantageous to employ bit signals that have as small a dynamic range as possible and to avoid excessively long sequences. Similar remarks apply to phase modulation, frequency modulation, and hybrid systems based on two or more of the above mentioned modulation techniques.

It is impossible to generate truly random signals of finite length. Pseudorandom sequences are known to the prior art; however, to satisfy the orthonormality conditions within a sufficient tolerance, the length of a pseudo-random sequence must be quite long. Hence, bit signals which are much longer than the optimum length must often be used if pseudo-random sequences are employed. Ideally one would like to be able to vary the length of the bit signals without altering the orthonormal character of the signals. No practical method for generating specified length sequences that appear random having this property is taught in the prior art.

In addition to the above mentioned problems, prior art systems are difficult to synchronize. Before a receiver can interpret the message sent by a transmitter, the transmitter and receiver must be synchronized. Initial synchronization is the most difficult to achieve. In long data transmissions, the receiver and transmitter must be periodically re-synchronized to correct for small differences in the frequencies of the clocks used in each device and/or drifts in the clock frequencies. In addition, changes in the distance between the transmitter and receiver can also lead to a loss of synchronization. Such changes in distance are encountered when one of the parties is utilizing mobile communications equipment such as a cellular telephone.

To achieve initial synchronization without using some form of non-channel sequence encoding, the phase of the receiver's clock is typically varied until a synchronization message is successfully decoded. The time needed to achieve initial synchronization is related to the length of the synchronization message and to the length of the bit signals used in the channel code. Hence, short synchronization messages and codes are preferred. However, the synchronization message must be long enough to guarantee that part of a valid message is not mistaken for a synchronization signal during the periodic re-synchronization procedures.

If non-channel encoded synchronization signals such as pilot tones are used, the power levels must be increased which can cause interference with other signals in the communication band. Such high power signals can be objectionable if the communication channel is being shared, as these signals would interfere with the other communications on the channel. In addition, in secure communication situations in which the user wishes to hide the fact that a communication is taking place, such high level signals can compromise the secrecy of the communication.

Broadly, it is an object of the present invention to provide an improved channel coding system.

It is a further object of the present invention to provide a channel coding codec utilizing orthonormal bit signals.

It is yet another object of the present invention to provide a channel coding system in which shorter synchronization signals than those used in prior art systems can be communicated without using non-spread spectrum codes and without being mistakenly interpreted by the receiver as part of a message.

It is a still further object of the present invention to provide a channel coding system in which the bit signals have the smallest possible dynamic range.

These and other objects of the present invention will be apparent to those skilled in the art from the following detailed description of the invention and the accompanying drawings.

SUMMARY OF THE INVENTION

The present invention comprises novel encoding and decoding apparatuses for generating a coded signal and decoding said coded signal, respectively. An encoding apparatus according to the present invention includes circuitry for receiving an input signal comprising an ordered sequence of symbols. The encoding apparatus includes a memory for storing a first flat channel coding basis comprising one or more channel sequences, each said channel sequence comprising an array of numerical values of length L, the number of said channel sequences being less than or equal to $\mu$, wherein $\mu$ is said to be the multiplier of said first channel coding basis and $\mu > 1$. A clock generates a sequence of timing signals. A controller included in the invention generates a sum array comprising an ordered array of numerical values $\sigma(k)$, for $k=0$ to $(L-1)$. The controller includes means for selecting a said channel sequence and for multiplying said selected channel sequence by a numerical value depending on said received symbol. The apparatus includes means for storing a channel coding array comprising an ordered array of numerical values $\beta(k)$ for $k=0$ to $(L-1)$. The sum array is combined with the spread spectrum array by adding $\alpha(k)$ to $\beta(k+\mu q)$, where q is a positive integer, at each clock pulse. The channel coding array is shifted each clock pulse and $\beta(L-1)$ is outputted. Then, $\beta(k)$ is replaced by $\beta(k-1)$ for $k=1$ to $(L-1)$, and $\beta(0)$ is replaced by 0.

The decoding apparatus comprises means for receiving an input signal. In response to timing signals from a clock, an ordered sequence of numerical values is generated from said input signal. The previously generated L said numerical values are stored by the decoding apparatus. The decoding apparatus also includes a memory for storing a first channel coding basis comprising one or more channel sequences, each said channel sequence comprising an array of numerical values of length L, the number of said channel sequences being less than or equal to It, wherein $\mu$ is equal to the multiplier of said channel coding basis. Every $q\mu$ timing signals, a correlator generates a signal related to the cross-correlation of said stored L and a said channel sequence stored in said memory means. Here, q is a predetermined positive integer. A value related to said generated signal is outputted by the decoding apparatus. Said value corresponds to the decoded signal.

DETAILED DESCRIPTION OF THE INVENTION

The present invention achieves its advantages through the use of novel orthonormal sequences for coding the data that are discussed in detail below. The manner in which the present invention operates may be more easily understood with reference to FIGS. 1 and 2 which are block diagrams of one embodiment of a channel coding signal encoder 10 and decoder 30 according to the present invention. While this embodiment is not the preferred embodiment of the present invention, its simplicity will more easily allow the reader to appreciate the manner in which encoders and decoders according to the present invention operate. Signal encoder 10 converts a stream of binary digits into a channel coded signal which is typically used to modulate an analog carrier signal. To simplify the drawings, the modulation of the carrier signal has been omitted.

Figure 1:
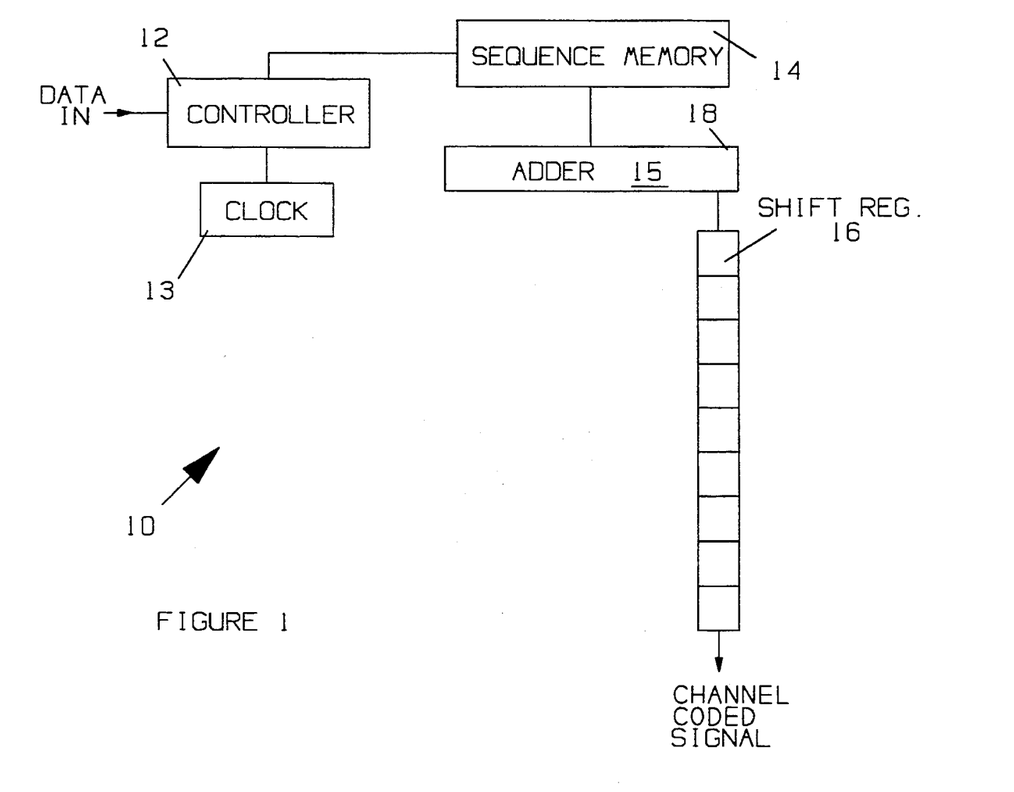
FIG. 1 is a block diagram of one embodiment of a signal encoder 10 according to the present invention.

This embodiment of the present invention operates by replacing each incoming bit by a bit signal sequence. The bit signal sequence is then combined with those from previously received data bits to generate a channel coded signal.

The operations of encoder 10 are controlled by a controller 12 which receives the input data stream. Controller 12 utilizes a clock 13 to define the various events that take place during the course of the signal encoding. In this embodiment of the present invention, one data bit is transmitted every two clock pulses. Once every two clock cycles controller 12 selects a bit signal sequence from sequence memory 14. The bit signal sequence so selected depends on the value of the data bit to be transmitted. The selected bit signal sequence will be denoted by $w_k(b)$ where k runs from 0 to L-1 and b denotes the value of the bit being transmitted, i.e., one or zero. Hence, sequence memory 14 must include at least two bit signal sequences.

Encoder 10 includes a shift register 16. The contents of shift register 16 will be referred to as the channel coding sequence in the following discussion. The values of the channel coding sequence will be denoted by $\beta(k)$, where k runs from 0 to L-1. The selected bit signal sequence is added by adder 15 to the contents of shift register 16 and the results stored back in shift register 16. That is, the operation $$\alpha(k) \leftarrow \alpha(k) + w_k(b) \quad (3)$$

for $k=0$ to L-1 is performed once every two clock cycles.

Once every clock cycle, the contents of shift register 16 are shifted by one position. A zero is shifted into the first position and the contents of the last position are outputted as the channel coded signal.

Provided the bit signal sequences satisfy the conditions discussed below, the encoded signal can be decoded by computing the cross-correlation of the channel coded signal with each of the bit signal sequences $w_k(b)$ for b=0 and b=1 once every two clock cycles.

Figure 2:
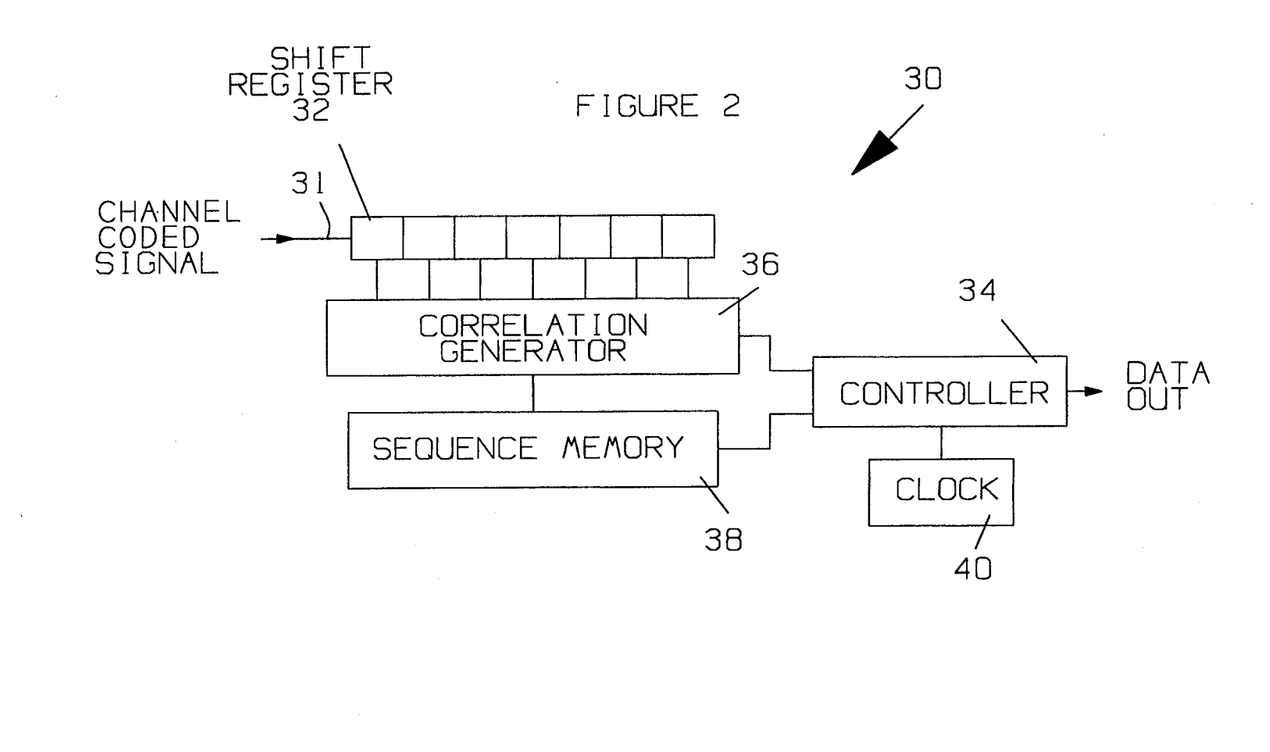
FIG. 2 is a block diagram of an exemplary decoder 30 according to the present invention.

The channel coded signal generated by encoder 10 may be decoded by computing the cross-correlation of the channel coded signal with each of the bit signal sequences. A block diagram of an exemplary decoder 30 according to the present invention is shown in FIG. 2.

A channel coded signal is received by decoder 30 on bus 31. This signal preferably comprises a sequence of digital values such as that generated by adder 15 discussed above. Typically, the digital values result from stripping a carrier signal from an incoming analog signal and subsequent digitization of the stripped analog signal. For simplicity, the circuitry for receiving and stripping said carrier signal has been omitted from the drawing, since such circuitry is conventional in the art. The relevant parts of the digitization circuitry will be discussed in more detail below with reference to the other embodiments of a decoder according to the present invention.

As each value is received, it is shifted into shift register 32 which includes L cells. Every 2 clock cycles, the cross-correlation of the L values stored in shift register 32 with each of the two bit signal sequences stored in sequence memory 38 is computed. The bit signal sequences in question are the same as those used by signal encoder 10 discussed above. The correlation operation is carried out under the control of controller 34. Controller 34 is connected to a clock 40 which is synchronized with the clock in the signal encoder that generated the input channel coded signal. The manner in which this synchronization is maintained will be discussed in more detail below.

In the absence of noise, the cross-correlation value will be 1 for one of the two bit signal sequences and 0 for the other bit signal sequence. In the presence of noise, the cross-correlation values will differ in absolute value from one and zero. In this case, the bit signal sequence having the maximum cross-correlation values provides the identity of the bit transmitted by encoder 10, provided that the absolute value of the cross-correlation is greater than some predetermined threshold value.

While the embodiments described above function adequately, these embodiments may not make optimal use of the bandwidth of the communication channel over which the channel coded signal is being transmitted. The channel coded signal generated by encoder 10 comprises a sequence of digital values which vary between some minimum value $V_{min}$ and some maximum value $V_{max}$. This signal is typically sent on a communication channel by modulating a carrier of some kind. The bandwidth of that channel must be sufficient to transmit the resulting channel coded signal. That is, the bandwidth must be sufficient to transmit B bits per clock pulse, where B is the number of bits needed to represent the difference between $V_{max}$ and $V_{min}$ to an accuracy sufficient to allow decoder 30 to decode the signal. In general, B will be a number significantly greater than 1. The manner in which the carrier is modulated to provide this capacity will be discussed in more detail below.

As noted above, encoder 10 receives and encodes one bit every two clock cycles. Hence, the communication channel is being used to transmit 0.5 bits per clock pulse. However, as noted above, the communication channel is capable of transmitting B bits per clock pulse where B>1. As a result, only a small portion of the available channel bandwidth is utilized by encoder 10. As a result of this inefficient utilization of channel bandwidth, the embodiment of the present invention discussed above is not the preferred embodiment. The preferred embodiment of the present invention provides a more efficient utilization of the channel bandwidth.

The preferred embodiment of the present invention may be more easily understood if the communication channel is viewed as comprising $\mu$ separate channels. Once every $\mu$ clock cycles, a "symbol" is sent on each of the separate channels. For reasons to be discussed below, one of the channels may be reserved for calibrating the encoder-decoder system. Hence, at least $\mu$-1 symbols representing the input data stream are transmitted every $\mu$ clock cycles. Each symbol is assumed to have one of N possible values. The symbols to be sent are accumulated by the encoder during the $\mu$ clock cycles between the last time the encoder encoded data and the current cycle. The order in which symbols are assigned to channels is preferably related to the order in which the symbol was received. If data specifying less than $\mu$-1 symbols is received since the last transmission, not all of the channels are utilized.

Figure 3:
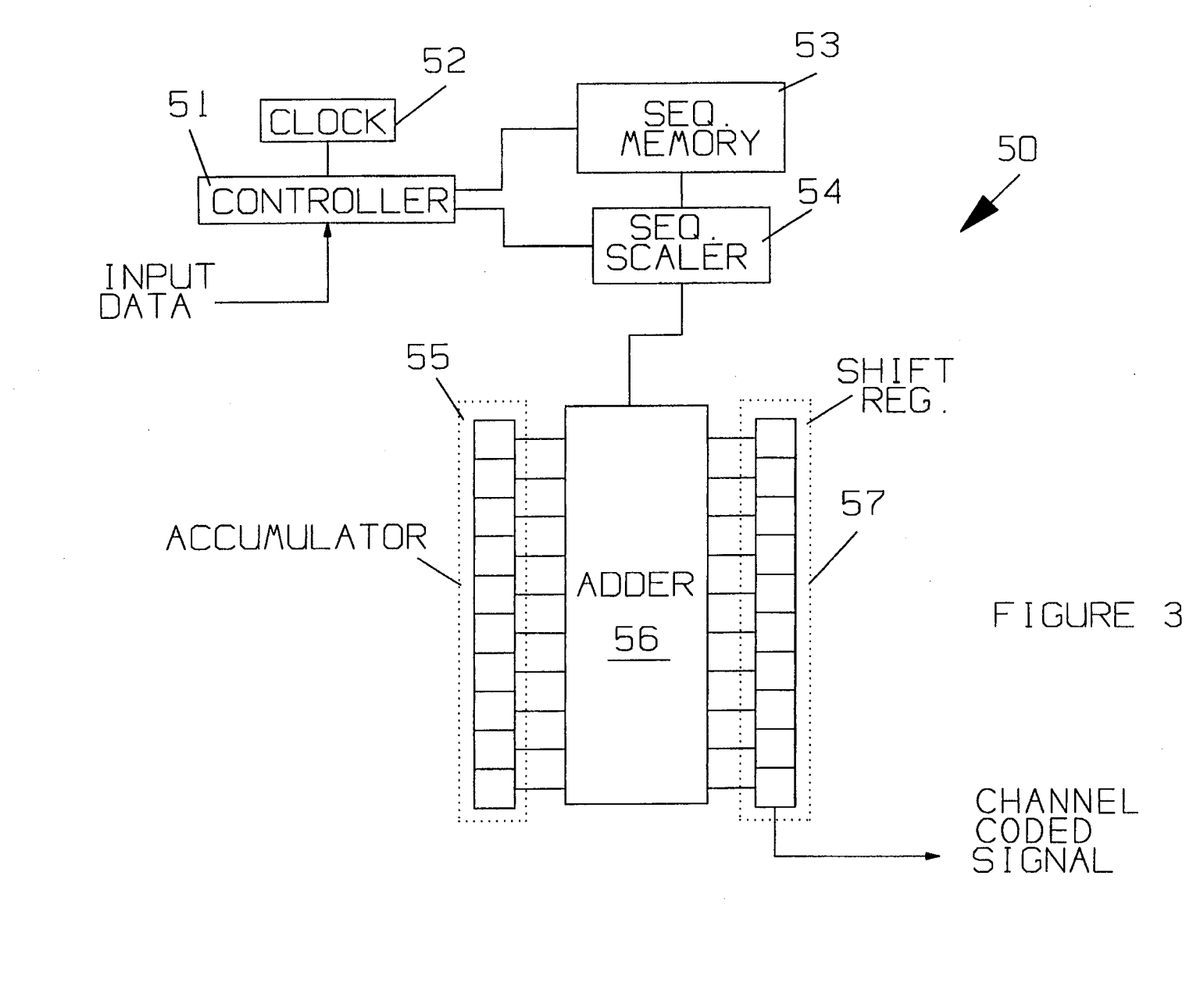
FIG. 3 is a block diagram of a second embodiment of a signal encoder according to the present invention.

A block diagram of an encoder 50 according to the preferred embodiment of the present invention is shown in FIG. 3. The input data is received by a controller 51 which is connected to a clock 52 which is used to synchronize the operations of encoder 50. Controller 51 converts the input data stream into a series of symbols, each symbol having one of N possible values. A symbol value comprising a numerical value between $-V$ and $+V$ is associated with each symbol. There are N discrete such values. Controller 51 also assigns a channel to each of the input symbols. The channel in question is preferably based on the order of receipt of the data specifying the symbol in question. However, embodiments in which the channel depends on the value of the symbol are also possible as will be discussed in more detail below.

A set of sequences of numbers analogous to the above described bit signal sequences is stored by encoder 50 in a sequence memory 53. One such sequence is stored for each channel. In the following discussion, these sequences will be referred to as the channel sequences. The channel sequences will be denoted by $w_p[m]$ where p runs from 0 to L-1, and m runs from 0 to $\mu$-1. A set of channel sequences satisfying $$\sum_{p=0}^{L-1} w_p(i)\, w_{p+\mu q}{}^*(j) = E\delta_{i,j}\delta_{q,0} \qquad (4)$$

where (*) denotes complex conjugation, E is a nonzero constant and the sum is performed over all values of p for which $w_p(i)$ and $w_{p+\mu q}(j)$ are non-zero will be referred to as a channel coding basis. Equation (4) is written in the general form for channel sequences that comprise complex numbers. If less than $\mu$ channel sequences are present in the basis, the basis will be referred to as a partial basis. Here, q is any integer, and $\delta_{x,y}$ is the delta function which is equal to 1 if x=y and 0 otherwise. For notational convenience, $w_p(i)$ is defined to be 0 for p<0 or p>(L-1).

Controller 51 utilizes a scaling circuit 54 to multiply each channel sequence by the symbol value associated with the symbol assigned to that channel to generate a scaled channel sequence. Corresponding elements of the scaled channel sequences are then added together to form a sum sequence, $\beta(k)$, for k=0 to L-1. That is $$\beta(k) = \sum_{p=0}^{m-1} S_p w_k(p) \qquad (5)$$

where $S_p$ is the symbol value corresponding to the symbol assigned to channel p. The sum signal is preferably stored in an accumulator 55 comprising a register containing L cells. It should be noted that the contents of accumulator 55 may be generated over the $\mu$ clock cycle period between transmissions. Hence, as data specifying a symbol is received by controller 51, the channel and symbol value for that data is assigned and the scaled channel sequence generated. The scaled channel sequence is then added to the contents of accumulator 55.

At the end of each $\mu$ clock cycle period, the contents of accumulator 55 are combined with the contents of a shift register 57 utilizing adder 56. Adder 56 adds corresponding cells in each register and places the results in the corresponding cell of shift register 57. For notational convenience, the contents of the $i^{th}$ cell of shift register 57 will be denoted by $\alpha(i)$. Hence adder 56 performs the replacement $$\alpha(k) \leftarrow \alpha(k) + \beta(k) \qquad (6)$$

for $k=0$ to $L-1$.

Shift register 57 performs an analogous function to that of shift register 16 described above. Once every clock cycle, the contents of shift register 57 are shifted by one position. A zero is shifted into the first position and the value stored in the last position is outputted as an element of the encoded signal. The encoded signal is then used to modulate a carrier. For simplicity, the circuitry for modulating the carrier has been omitted from the figures. It will be apparent to those skilled in the art that any of a number of modulation schemes including amplitude modulation, phase modulation, frequency modulation, or hybrids thereof may be used for transmitting the encoded signal.

The coded signal generated by encoder 50 may be decoded by computing the cross-correlation of the encoded signal with each of the $\mu$ channel sequences in a manner analogous to that described above with reference to decoder 30. After demodulating the carrier to recover the encoded signal, the encoded signal is again shifted into an L-cell shift register. Once every $\mu$ clock cycles, the cross-correlation of the contents of the shift register and each of the channel sequences is computed. In the absence of noise, the cross-correlation value will be proportional to the symbol value used to modulate the channel sequence in question. The constant of proportionality is the same for all channels. The constant of proportionality will depend on the mode of modulation of the carrier. For example, if amplitude modulation is used, the constant is determined by the various gains and losses in the transmission of the signal between the encoder and decoder. If this constant of proportionality were known, the identity of the symbol being sent could be determined.

In certain communication systems, the constant of proportionality will be known in advance. For other systems, the constant of proportionality will depend on the location of the transmitter and other factors that may change with time such as noise and transmitter location. The constant of proportionality can be determined by only sending message symbols in ($\mu-1$) of the channels. The remaining channel is used to send a predetermined symbol. This channel will be referred to as the calibration channel in the following discussion. The symbol sent in this channel will be referred to as the calibration symbol. Since the symbol in this channel is always known, the constant of proportionality may be determined. In general, the constant of proportionality is a complex number having both a magnitude and phase. The manner in which this constant is used to calibrate the system will be evident to those skilled in the art. For example, if amplitude modulation is used, the ratio of the correlation value in the calibration channel to the correlation in a channel used to send a symbol will yield the symbol value in question.

As noted above, when noise is present, the absolute value of the cross-correlation values will be less than the absolute value of the symbol signal. The degree to which the cross-correlation values are altered limits the number of possible symbol values that can be sent. When the cross-correlation value is altered by an amount equal to half the difference between adjacent symbol signal values, an error will occur.

The severity of this error will depend on the type of data being transmitted in the channel. If the data being transmitted were computer data, any error might be unacceptable. In this case, the number of possible symbol values would be chosen to be small enough to guarantee that the minimum difference in the cross-correlation values between symbols is greater than the change in the cross-correlation values resulting from noise.

If, on the other hand, the data being transmitted can incur some errors, a greater number of symbol values may be utilized thereby increasing the capacity of the communication path. For example, consider the case in which each symbol represents the amplitude of an analog signal at a particular time. If the symbol signal values are chosen such that a small error in signal value results in the assignment of an amplitude which differs by only a small amount from the correct value, a non-zero error rate may be acceptable. Such digitized versions of analog transmissions are common in the telecommunication arts.

It should also be noted that the number of possible symbol values may be varied in response to the level of noise on the communication path. Digital data commonly includes check sums, parity bits, and other means for detecting errors. Consider a transmission system in which the receiver tests for errors in the incoming data. If the detected error rate is too high, the receiver signals the transmitter. The transmitter then switches to a symbol library having half the number of possible symbol values, and hence, twice the spacing between symbol signal values. This new library will result in lower error rates; however, the amount of data transmitted per unit time will be reduced by a factor of two. When the noise subsides, the receiver will note a very low error rate. The receiver can then signal the transmitter to switch back to the symbol library having more symbol values.

Thus the present invention provides a means for dynamically adapting a communication channel in a manner that more fully utilizes the channel capacity for a predetermined noise error rate.

It should also be noted that the noise errors may also be reduced by switching to a different channel coding basis having channel sequences with increased lengths. In the preferred embodiment of the present invention, the sequence memories are used to store a plurality of channel coding bases of different lengths. When increased noise is detected, the decoder signals the encoder to switch to a basis having an increased length. In general, this will also result in a decrease in the data throughput even if a basis having the same value of $\mu$ is utilized. Increasing the length of the basis results in larger maximum and minimum values for the channel coded signal since a larger number of scaled channel sequence values contributes to each value in the spread spectrum signal. However, as pointed out above, the difference in these values that can be accommodated is determined by the bandwidth of the communication channel. Hence, unless the bandwidth of the communication channel can be increased, this difference in values may not be increased. The simplest method for limiting this difference is to reduce the scaling factors, i.e., the symbol values, used to scale the channel sequences when the length of the basis is increased. However, if this is done, the number of possible symbol values must also be reduced. Hence, the throughput of the system will be decreased.

Alternatively, the number of overlapping channel sequences present at any time could be reduced by encoding symbols at a rate less than once every $\mu$ cycles; however, this strategy also reduces the throughput of the system. The above described embodiments of the present invention transmit $\mu$ symbols every $\mu$ clock cycles. If this protocol leads to excessive overlapping, $\mu$ symbols can be transmitted ever $k\mu$ clock cycles, where k is any positive integer. For example, $\mu$ symbols could be transmitted every other $\mu$ clock cycles. In this case, the sum signal is generated every $k\mu$ clock cycles and added to the accumulator. The contents of the accumulator are still shifted once each clock cycle. Hence, the degree of overlap of different sum signals in the encoded signal is reduced. Unfortunately, the data throughput is also reduced by a factor of k.

The embodiments of the present invention shown in FIGS. 1 and 3 are examples of two different methods for assigning the "channel" to an incoming data symbol. In the embodiment shown in FIG. 1, the incoming data is broken into symbols having only two possible values, zero or one. The channel on which a particular symbol was transmitted was determined by the value of the symbol. In contrast, the embodiment shown in FIG. 3 selected the channel by the order of receipt of the data comprising the various symbol values.

Additional security can be provided to the embodiment shown in FIG. 3 by assigning the channel based both on the value of a symbol and its order of receipt. In this case, an unauthorized listener would need to know both the channel sequences in use and the current rule for assigning a channel to a symbol. Without this later information, the decoded message would be scrambled in the time domain.

As noted above, the signal decoder must be synchronized with the signal encoder. The time delay between the generation of an encoded signal by the encoder and the reception of that signal by a decoder is, in general, not known. In practice, the signal generated by the encoder is used to modulate an analog carrier signal. The analog carrier signal is transmitted to a receiver which strips the carrier signal, thereby generating an analog signal representing the original encoded signal. The analog signal is then digitized using some form of A/D circuit to form a numerical sequence which is utilized by a decoder to decode the channel encoded transmission. Since the various circuit delays and transmission delays are not known, some means for establishing synchronization must be provided.

Two levels of synchronization are needed. First, the A/D circuit mentioned above must be synchronized with the clock in the encoder to guarantee that the numerical sequence values generated by the A/D circuit represent values generated by the encoder. If the digitization is improperly timed, the resulting numerical sequence will bear little resemblance to the encoded signal generated by the encoder.

Second, the decoder must determine when each $\mu$ clock cycle time period begins. The cross-correlation operation will not yield the correct values unless the portion of the channel encoded signal that includes all of the values for a particular sum signal is correctly aligned in the shift register of the decoder. There are $\mu$ possible alignments.

The initial synchronization is provided by sending a synchronization signal from the signal encoder to the signal decoder at the start of the message. The simplest form of synchronization signal would be one having a level sufficiently above the ambient background to be easily detected by the signal decoder. Unfortunately, such a large amplitude signal would be objectionable in many cases. For example, if the channel coded communication system were being utilized to multiplex two communication systems in the same band, the synchronization signal might interfere with the second communication system. If the channel coded communication system were being utilized to hide a communication for security purposes, the synchronization signal could be utilized by an eavesdropper to detect the presence of the hidden communication. Hence, a high amplitude synchronization signal is not preferred.

A second prior art method of synchronizing a receiver and transmitter is to send a synchronization message. The message consists of a predetermined bit sequence which is repeated until the signal decoder signals the signal encoder that it has acquired synchrony. Since the bits are sent by the signal encoder in a manner identical to any other message, the problems described above are avoided. Unfortunately, such a synchronization message may be difficult to detect. To detect the message, the signal decoder must search all possible clock phases within a $\mu$ clock cycle window until it finds a phase at which the synchronization message is decoded.

It should also be noted that even if the synchronization message is received and the signal decoder and signal encoder are initially synchronized, the signal decoder must periodically resynchronize itself to the signal encoder. It is economically impractical to produce two clocks, one in the signal decoder and one in the signal encoder, that operate at frequencies which are sufficiently close for the devices to remain in synchrony throughout a long message. Furthermore, there may be many signal decoder and signal encoder pairs in a communication system which further increases the cost by requiring that all of the devices have identical clocks. Hence, systems having less accurate clocks which are periodically resynchronized is preferred. Finally, as noted above, the time delay between transmission of the signal at the encoder and reception at the decoder may change as the result of a change in distance between the encoder and decoder.

The periodic resynchronization may be accomplished by sending a periodic resynchronization message or by waiting until synchronization is lost and repeating the initial synchronization process. The later condition can be detected by observing a high error rate in the message being sent. Such errors are routinely detected by including check sums in the digital data. This method, however, is not preferred because it interrupts the communication channel during the time needed to resynchronize and introduces a significant degree of complexity into the spread spectrum signal decoder circuitry.

If a periodic synchronization message is used it must be of a form that will not be confused with the informational messages being sent on the communication channel. Hence, it must, in general, be a long message. In addition, circuitry must be introduced at the signal encoder to be sure that no such illegal data message is generated by mistake.

The present invention provides a means for avoiding the above described synchronization problems. In any message sent using the preferred embodiment of the present invention, there is one channel which is reserved for the symbol used to compute the constant of proportionality described above. Since the calibration symbol is known, the value obtained by computing the cross-correlation in this channel is indicative of the state of synchronization. Hence, a synchronization signal is always available in the present invention independent of the data being transmitted.

Initial synchronization may be established by shifting the clock phase in a clock cycle time window and computing the cross-correlation value in the calibration channel. The correct clock phase is the phase which maximizes the cross-correlation value. In the presence of noise, the maximum value for any given transmission may occur at a clock phase which is off the correct phase. Hence, in the preferred embodiment of the present invention, several values for the cross-correlation in question are averaged. Each such value is measured at the same clock phase but separated by $\mu$ clock cycles from the previous clock phase.

Figure 4:
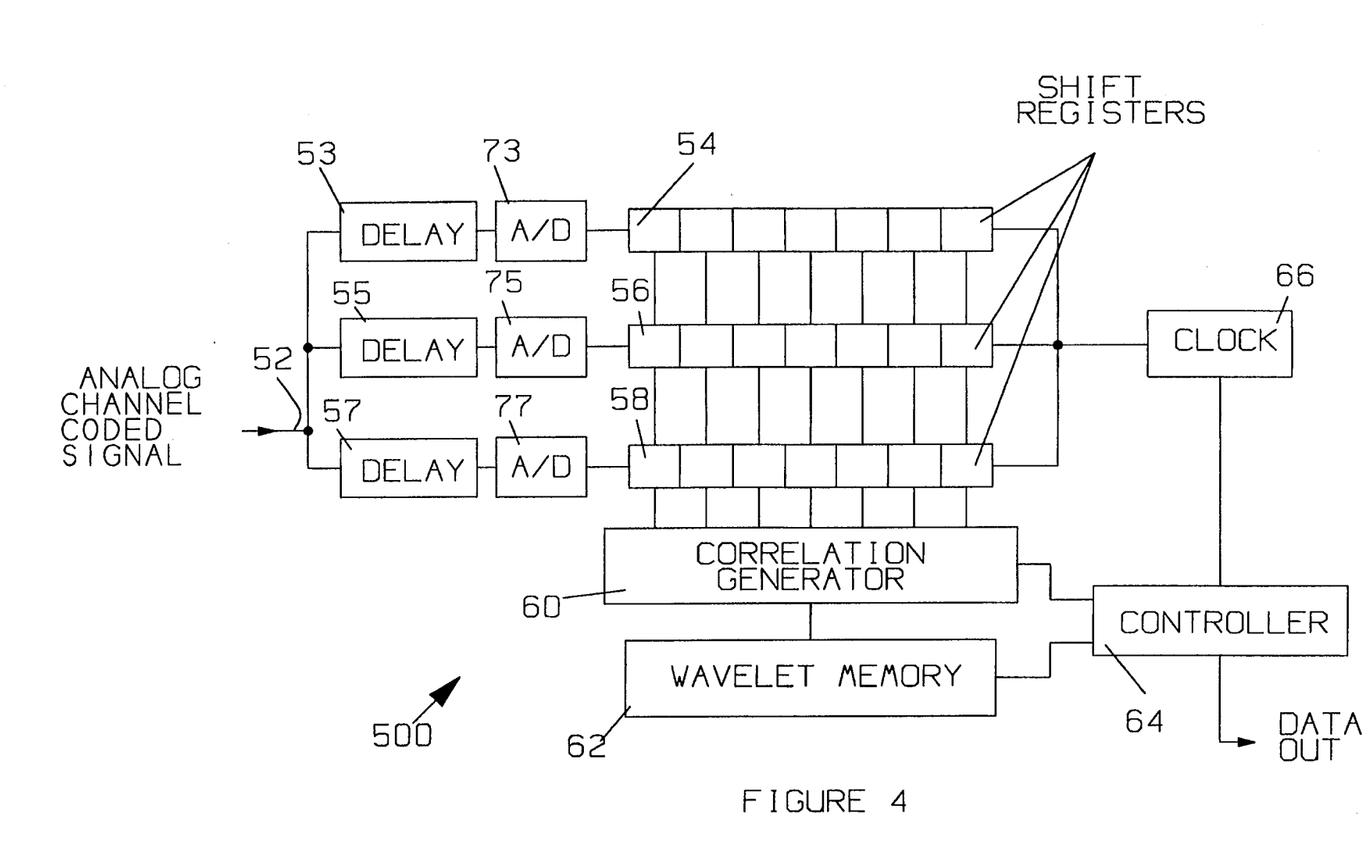
FIG. 4 is a block diagram of an exemplary channel coded signal decoder 500 having circuitry for detecting and correcting for drift in synchronization.

This technique may also be used to periodically resynchronize the transmitter and receiver during the transmission of a message. An exemplary signal decoder having circuitry for detecting and correcting for drift in synchronization is shown in FIG. 4 at 500. The analog encoded signal is received on signal bus 52. This signal is typically generated by stripping a carrier signal from a high frequency carrier that was modulated by the digital encoded signal generated by an embodiment of an encoder according to the present invention. The analog signal is digitized by A/D circuits prior to being shifted into each of three shift registers 54, 56, and 58. The corresponding delay circuits are shown at 53, 55, and 57, respectively. The A/D circuits corresponding to these delay circuits are shown at 73, 75, and 77 respectively. The delays are chosen such that delay 55 is slightly larger than delay 53, and delay 57 is slightly larger than delay 55. The shifting operations are synchronized to clock 66 whose phase is under the control of controller 64.

In the absence of a shift in synchronization, shift register 56 contains the correct signal values. Suppose the synchronization between the signal encoder and signal decoder shifts such that the signal arrives at signal decoder too early. In this case, shift register 54 will have more accurate values. Similarly, if the synchronization between the signal decoder and signal encoder shifts such that the signal arrives at signal decoder too late, then shift register 52 will contain the more accurate values.

The cross-correlation of the contents of each of the shift registers with each channel sequences in wavelet memory 62 is generated once every $\mu$ clock cycles. A calibration signal equal to the sum of the absolute values of the cross-correlation values for each of the channel sequences may be computed for each shift register. In the absence of noise, this calibration signal will have its highest value for the shift register having the most accurate values. Hence, synchronization drift will result in one of the shift registers other than shift register 56 having the maximum sum value. The identity of the shift register indicates the direction of the shift. A correction to the clock phase is made by controller 64 when such a shift is detected.

In the presence of noise, the foregoing discussion will be correct on average. However, individual cross-correlation measurements may result in shift register 54 or 56 having the maximal sum cross-correlation measurement even when the synchronization is correct. To avoid making an erroneous clock phase correction, controller 64 preferably averages the results of several cross-correlation measurements before making a clock correction.

Having provided the above description of the preferred embodiments of a signal decoder and signal encoder according to the present invention, a more formal definition of the present invention will now be given. Following this description, the manner in which the channel sequences are calculated will be explained in detail.

A specific channel sequence W(k) is associated with each channel. Each channel sequence W(k) consists of a finite sequence of numbers; thus, each sequence is represented by a finite dimensional vector. The finite sequence of numbers that are the coordinates of the vector are permitted to be complex numbers. A sequence representing the sums of sequences of complex numbers can be transmitted as ordered pairs of real numbers, each pair corresponding to the real and imaginary parts of the complex number in question. They can be transmitted by simultaneously adjusting the amplitude and phase of the electromagnetic carrier. The possible methods for modulating a carrier with such a sequence of complex values will be discussed in more detail below. Thus, the $k^{th}$ channel sequence, W(k), has the form $$W(k) \triangleq (w_0(k), \ldots, w_{L-1}(k)), \quad (7)$$

where the vector components $w_j(k)$ are complex numbers. The number of components, L, of the waveform is the dimension of the waveform vector W(k). As noted above, there are $\mu$ such waveforms. That is, k runs from 0 to $\mu$-1. The set of $\mu$ waveforms will be referred to as the basis of the channel coding communication system.

The manner in which a basis is calculated will now be discussed in more detail. As noted above, the first requirement for basis is orthogonality. This requirement imposes the constraints shown in Eq. (4).

In secure communication settings, it would be advantageous to require the channel sequences to satisfy one additional constraint, namely $$\sum_{p=0}^{L-1} w_p(i) = 0 \quad (8)$$

for one or more of the channel sequences. This constraint guarantees that encoded signals that only employ such channel sequences have a DC average of zero over a time frame of L clock cycles. In applications in which one signal is "hidden" in a second signal, the hidden signal will be more difficult to detect if this constraint is satisfied. In the absence of such a constraint, the average value of the DC component of the encoded signal will be approximately zero over a time frame which is greater than L clock cycles. This latter result assumes that the symbol values are spread between $-N$ and $N$ such that the average symbol value is zero. Here, N is some number. In practice, this constraint can be realized for all but one of the $\mu$ channel sequences disclosed herein.

In principle, numerical values satisfying Eq. (4) for a given value of g may be calculated by conventional numerical procedures on a digital computer. Some examples of bases are given in Table I for some relatively small values of L.

In general, the solutions of Eq. (4) are irrational numbers. For example, a solution of this equation for $L=4$ and $g=2$ is as follows:

$$W(0) = [(1 + \sqrt{3})/4, (3 + \sqrt{3})/4, (3 - \sqrt{3})/4, (1 - \sqrt{3})/4] \tag{9}$$

$$W(1) = [(1 - \sqrt{3})/4, -(3 - \sqrt{3})/4, (3 + \sqrt{3})/4, -(1 + \sqrt{3})/4] \tag{10}$$

If the waveform values are coded directly as real numbers, it will not, in general, be possible to exactly represent the waveform values in a computer. The numerical round-off error may have adverse cumulative effects when large numbers of long waveforms are overlapped in a typical background environment of a noisy channel. In principle, a detailed analysis can be conducted which provides restrictions on waveform length and numerical round-off error to insure accurate reception and decoding of the waveform by the receiver matched filter.

A second problem with this type of waveform lies in the number of different values in the waveform. For example, the waveforms shown in Eqs. (9) and (10) have four different absolute values. As pointed out above, the amount of information that can be sent in a channel depends on the dynamic range of the waveforms. Waveforms with a large number of different values require a greater dynamic range, and hence, are to be avoided. The waveform requiring the minimum dynamic range is one having only two states for each waveform value. Since the waveform will be multiplied by a gain constant when it is used to modulate the carrier in the transmission system, the absolute value of the two states is not important. Hence, the ideal waveform would be one in which $w_p(i) = 1$ or $-1$. It should be noted that such waveforms also avoid the round-off error problems discussed above.

The simplest waveforms satisfying this constraint for $g=2$ have two components $$W(0)=[1,1] \tag{1}$$

$$W(1)=[1-1] \tag{12}$$

The waveforms $$W(0)=[1,1] \tag{13}$$

$$W(1)=[-1,1] \tag{14}$$

also have the desired property for length two.

In principle, one could search for longer waveforms using digital computers. However, as noted above, very long waveforms are often desirable, and the computational workload for generating these can be too large for conventional computers.

In addition, there are situations in which it would be advantageous to rapidly switch between different bases of long digital waveforms during the communication. Such "hopping" between bases provides a means for further increasing the security of the communication path. The computational workload to generate a new set of digital waveforms in real time is too high for such o hopping to be practical unless all possible sets have been stored in advance in both the transmitter and receiver. However, such pre-storage requires a substantial amount of storage space.

In addition, pre-storage can compromise system security. In secure communication systems, the waveforms comprise codes for encoding communications. The success of such a coding scheme depends on keeping the codes secret, thereby forcing an unauthorized person to search all possible codes in order to decode the message. The difficulty of searching all possible codes is significantly reduced if the searcher knows in advance that the codes must be contained in some predetermined list which has significantly fewer entries than the list of all possible codes. If the codes are pre-stored, an unauthorized person can gain access to the "reduced list" by examining a transmitter or receiver.

The manner in which long waveforms can be generated from smaller waveforms will now be discussed. Assume that a channel coding basis of length N is known. Denote the channel sequences of this basis by $^NW(k)$, where k runs from 0 to N-1. For any given multiplier It, the shortest waveforms satisfying Eq. (4) can be shown to have It components. Hence, N must be at least $\mu$. For the purposes of this discussion, it will be assumed that It is even. The general case will be discussed in more detail below. A channel coding basis comprised of channel sequences of length 4N and multiplier $\mu$ may be constructed as follows. Each channel sequence in the new basis may be viewed as consisting of 4 smaller channel sequences or their negatives selected from the smaller basis placed end-to-end as shown below.

$$^{4N}W(0) = [^NW(0), ^NW(1), ^NW(0), -^NW(1)] \tag{15}$$
$$^{4N}W(1) = [^NW(0), ^NW(1), -^NW(0), ^NW(1)]$$
$$\vdots$$
$$^{4N}W(4N-2) = [^NW(N-2), ^NW(N-1), ^NW(N-2), -^NW(N-1)]$$
$$^{4N}W(4N-1) = [^NW(N-2), ^NW(N-1), -^NW(N-2), ^NW(N-1)]$$

For example, consider the multiplier 2 basis given in Eqs. (11)–(12) above.

$$^2W(0)=[1,1] \tag{16}$$

and $$^2W(1)=[1,-1] \tag{17}$$

A basis consisting of vectors of length 8 constructed may be constructed according to the relation shown in Eqs. (15) as follows:

$$^8W(0)=[^2W(0),^2W(1),^2W(0),-^2W(1)]=[1,1,1,-1,-1,1,-1,1] \quad (18)$$

$$^8W(1)=[^2W(0),^2W(1),^2W(0),^2W(1)]=[1,1,1,-1,1,1,-1,1] \quad (19)$$

The operations described in Eqs.(15) may be repeated on $^8W(0)$ and $^8W(1)$ to obtain a basis having channel sequences of length 32, and so on.

For reasons of notational convenience, it is useful to define a channel coding matrix whose rows are the channel sequences. The channel coding matrix associated with a set of channel sequences $W(k)$ will be denoted by W, where $$W = \begin{bmatrix} W(0) \\ W(1) \\ \cdot \\ \cdot \\ \cdot \\ W(\mu-1) \end{bmatrix} \quad (20)$$

It will be apparent from the properties of a channel coding basis as defined above that there are other methods to generate a second channel coding basis from a first such basis. For example, a new channel coding basis may be obtained by multiplying any row in the channel coding matrix other than the first row by $-1$. Further, the elements of each of the row vectors can be reversed in order. In general, any elementary row and column operations that do not alter Eq. (4) can be performed.

The above described methods for obtaining flat channel coding bases assume that at least one such basis is already known. As noted above, the smallest channel coding basis for multiplier $\mu$ consists of $\mu$ channel sequences, each channel sequence having $\mu$ values. Such a basis may be represented by a $\mu \times \mu$ matrix. For multiplier 2, there are two such matrices:

$$H_1 = \begin{bmatrix} 1 & 1 \\ 1 & -1 \end{bmatrix} \quad (21)$$

$$H_2 \begin{bmatrix} 1 & 1 \\ -1 & 1 \end{bmatrix} \quad (22)$$

Each of these matrices may be used to generate larger channel coding matrices for multiplier 2 using the methods described above. In addition, these multiplier 2 lo matrices may be used to generate other $\mu \times \mu$ matrices in which $\mu = 2^n$, where n is any positive integer $>1$. In particular, it can be shown that if H' is a channel coding matrix for multiplier $\mu'$ and H" is a channel coding matrix for multiplier $\mu'''$, then the tensor ("Kronecker") product $$H = H' \oplus H' \quad (23)$$

is a channel coding matrix representing a basis having multiplier $\mu'\mu''$. Hence, the tensor product operating on either of the matrices shown in Eqs. (21)–(22) may be used to construct matrices of the minimal size for multipliers $2^n$.

The above discussion assumed that the multiplier of the channel coding basis was an even integer. The manner in which channel coding bases having arbitrary integer multipliers can be constructed will now be described. The above described channel coding bases were constructed from channel sequences consisting of real numbers. In general, a flat channel coding basis for non-even multipliers is constructed from channel sequences that may include complex numbers. The manner in which the complex valued channel sequences are used to modulate a carrier will be described in more detail below.

For multiplier $\mu$, the smallest flat channel coding basis will consist of $\mu$ channel sequences of length $\mu$ and can be represented by a matrix H having components $$H_{jk} = \omega^{jk} \quad (24)$$

where $$\omega = e^{2\pi i/\mu} \quad (25)$$

and $0 \leq j,k < |\mu''$. Here, $i = \sqrt{-1}$. It should be noted that H has entries with more than two different values. In the more general case of a complex valued channel coding basis, the basis will be defined to be "flat" if each element in each of the channel sequences can be written in the form $a + b\ f_i$, where a and b are constants having the same values for all elements of the channel sequences, and $f_i$ is a complex number having an absolute value of one. As noted above, such a basis may be transmitted by modulating the phase of the carrier. Here, $f_i$ depends on the specific element of the channel sequence in question. Normally, the constant "a" will be zero. It is included in this definition only for the sake of generality. In the case of real valued bases, the possible values for $f_i$ are $\pm 1$.

The manner in which the channel coding basis H may be extended to provide a channel coding basis having channel sequences of length $>\mu$. It will now be described. Let W be a channel coding matrix representing a channel coding basis with multiplier $\mu$ in which each of the channel sequences has length N. N must be an integer multiple of $\mu$. Define $\nu = N/\mu$. A new channel coding basis having channel sequences of length $N' = \mu^2 N$ represented by a spread spectrum matrix W' may be obtained as follows $$W'_{j,k+p\mu} = \omega p^{(j-k)} W_{j,k}, \quad (26)$$

Where $0 \leq p < \nu$, $0 \leq j < \mu$, and $0 \leq k < \mu$. For example, suppose W consisted of a multiplier 3 spread spectrum matrix having row vectors a,b, and c, i.e., $$W = \begin{bmatrix} a \\ b \\ c \end{bmatrix} \quad (27)$$

then, $$W' = \begin{bmatrix} a & b & c & a & \omega b & \omega^2 c & a & \omega^2 b & \omega c \\ a & b & c & \omega a & \omega^2 b & c & \omega^2 a & \omega b & c \\ a & b & c & \omega^2 a & b & \omega c & \omega a & b & \omega^2 c \end{bmatrix} \quad (28)$$

It should be noted that there are other channel coding bases that satisfy the orthogonality constraints taught in the present invention. Some of these may be obtained by performing elementary row and column operations on the channel coding matrices. Others may be found by conventional computer searching techniques.

As noted above many of the bases obtained in this manner for g>2 are composed of sequences of complex numbers. As noted above, a complex number may be transmitted by using its real and imaginary parts to separately modulate the carrier. There are a number of methods for accomplishing this modulation. For example, the absolute value of the number may be used to modulate the amplitude of the carrier while the phase angle of the complex number is used to modulate the phase of the carrier. Alternatively, the real and imaginary parts of the complex number can be used to modulate the amplitude of the carrier at two different points in time. Similarly, the frequency of the carrier may also be modulated either separately, or in combination with, the phase and amplitude of the carrier.

The above embodiments of the present invention have assumed that the sequence memories store all of the sequences for a basis. It will be apparent to those skilled in the art that embodiments of the present invention that utilize less than all of the available sequences in a basis are possible. Such embodiments would only need to store a partial basis in the sequence memories. Such embodiments of the present invention are equivalent to the ones discussed above with only a portion of the channels being utilized.

While the above embodiments used the various channels to send different portions of the same input data stream, it will be apparent to those skilled in the art that different channels can be used to send different data streams. Such an embodiment of the present invention would provide a means for multiplexing a plurality of communications on a single communication path while providing the benefits of channel coding transmission.

While the above embodiments of an encoder according to the present invention construct a channel coded signal by combining the sum signal with the spread spectrum sequence stored in the shift register every $\mu$ clock cycles, it will be apparent to those skilled in the art that this combining operation will yield a valid encoded signal if it is carried out at any integer multiple of $\mu$ clock cycles. For example, the combining operations could be performed every $2\mu$ clock cycles. As pointed out above, such a system would have a lower data throughput; however, the required dynamic range of the communication channel used to send the signal would be reduced.

It should also be noted that the channel coding system taught in the present invention may be used to service one user or a plurality of users. In a single user system, incoming symbols from that user would be assigned to different channels in some predetermined order. The output of the various channels at the decoder would then be combined using the known order to form a single output data stream. In multi-user systems, each user is assigned one or more channels for that user's communication. If the user is assigned more than one channel, the symbols from that user would be assigned to the various channels in some predetermined order.

There has been described herein a novel apparatus and method for coding and decoding an image. Various modifications to the present invention will become apparent to those skilled in the art from the foregoing description and accompanying drawings. Accordingly, the present invention is to be limited solely by the scope of the following claims.

What is claimed is:

1. A signal encoding apparatus comprising:

means for receiving an input signal comprising an ordered sequence of symbols;

memory means for storing at least a portion of a first channel coding basis comprising one or more flat channel sequences, each said channel sequence comprising an array of numerical values of length L, where L≧2, the number of said channel sequences being less than or equal to $\mu$, wherein $\mu$ is equal to the multiplier of said first channel coding basis;

clock means for generating a sequence of timing signals;

control means for generating a sum array comprising an ordered array of numerical values $\alpha(k)$, for k=0 to (L-1), said control means comprising means for selecting a said channel sequence and for multiplying said selected channel sequence by a numerical value depending on one of said received symbol;

means for storing a channel array comprising an ordered array of numerical values $\beta(k)$ for k=0 to L-1;

means for combining said sum array with said channel array comprising means for adding $\alpha(k)$ to $\beta(k+\mu q)$, where q is a positive integer, said combining means being responsive to said clock means having generated $\mu q$ said timing signals; and shifting means for outputting $\beta(L-1)$, for replacing $\beta(k)$ by $\beta(k-1)$ for k=1 to (L-1), and for replacing $\beta(0)$ by 0, said shifting means being responsive to said clock means having generated one of said timing signal;

wherein said control means being operatively connected to said receiving means, said memory means, said clock means, said means for storing a channel array, said means for combining said sum array, and said shifting means.

2. The signal encoding apparatus of claim 1 wherein said channel sequence selected by said control means depends on the order of receipt of said received symbol.

3. The signal encoding apparatus of claim 1 wherein said means for multiplying said selected channel sequence by a numerical value in said control means comprises means for multiplying said channel sequence by a numerical value depending on one of said received symbol.

4. A signal decoding apparatus comprising:

means for receiving an input signal;

clock means for generating a sequence of timing signals;

means for generating an ordered sequence of numerical values from said input signal and for storing the previously received L said numerical values, where L ≧2, said generating means being responsive to said timing signals;

memory means for storing at least a portion of a first channel coding basis comprising one or more channel sequences, each said channel sequence comprising an array of numerical values of length L, each said numerical value having one of two possible values, the number of said channel sequences being less than or equal to $\mu$, wherein $\mu$ is equal to the multiplier of said channel coding basis;

correlation means, operatively connected to said receiving means, said clock means, said means for generating an ordered sequence, and said memory means, for generating a signal related to the cross-correlation of said stored L and one of said channel sequence stored in said memory means, said correlation means being responsive to said clock means having generated $q\mu$ said timing signals wherein q is a predetermined positive integer; and means for outputting a value related to said generated signal generated by said correlation means.

5. The signal decoding apparatus of claim 4 further comprising delay means for between said receiving means and said generating means for introducing a variable delay between the receipt of said input signal and the generation of said ordered sequence of numerical values.

6. A method for encoding a signal comprising the steps:

receiving an input signal comprising an ordered sequence of symbols;

storing at least a portion of a first channel coding basis comprising one or more channel sequences, each said channel sequence comprising an array of numerical values of length L, each said numerical value having one of two possible values, the number of said channel sequences being less than or equal to $\mu$, wherein $\mu$ is equal to the multiplier of said first channel coding basis;

generating a sequence of timing signals;

generating a sum array comprising an ordered array of numerical values $\alpha(k)$, for $k=0$ to (L-1), said generating step comprises selecting a said channel sequence and multiplying said selected channel sequence by a numerical value;

storing a channel array comprising an ordered array of numerical values $\beta(k)$ for $k=0$ to L-1;

combining said sum array with said channel array, said combining step comprising adding $\alpha(k)$ to $\beta(k+\mu q)$, where q is a positive integer, said combining step being responsive to the generation of $\mu q$ said timing signals; and at each timing signal, outputting $\beta(L-1)$, replacing $\beta(k)$ by $\beta(k-1)$ for $k=1$ to (L-1), and replacing $\beta(0)$ by 0.

7. The method of claim 6 wherein said selected channel depends on the order of receipt of said received symbol.

8. The method of claim 6 wherein said step of multiplying said selected channel sequence by a numerical value comprises multiplying said channel sequence by a numerical value depending on one of said received symbol.

* * * * *

UNITED STATES PATENT AND TRADEMARK OFFICE
CERTIFICATE OF CORRECTION

PATENT NO. : 5,359,627

DATED : October 25, 1994

INVENTOR(S) : Howard L. Resnikoff

It is certified that error appears in the above-indentified patent and that said Letters Patent is hereby corrected as shown below:

[75] Inventor: delete "Wincester" and insert therefor --Winchester--.

Column 5, line 53, delete "It" and insert therefor --$\mu$--.

Column 13, line 22, before "clock" insert --$\mu$--.

Column 14, line 41, delete " $\leq$ " and insert therefor -- = --.

Column 15, line 3, delete "and." and insert therefor --and--.

Column 15, line 9, delete "g" and insert therefor --$\mu$--.

Column 15, line 15, delete "g=2" and insert therefor --$\mu$=2--.

Column 15, line 57, delete "g=2" and insert therefor --$\mu$=2--.

Column 16, line 13, delete "o".

Column 16, line 36, delete "It" and insert therefor --$\mu$--.

Column 16, line 37, delete "It" and insert therefor --$\mu$--.

Column 16, line 39, delete "It" and insert therefor --$\mu$--.

Column 17, lines 1,2, in equation (18) delete "[1,1,1, —1, -1, 1—1,1] and insert therefor --[1,1,1,-1,1,1,-1,1]--.

Column 17, lines 2,3, in equation (19) delete "[1,1,1, —,1,1-,—,1]" and insert therefor --[1,1,1,-1,-1,-1,1,-1]--.

UNITED STATES PATENT AND TRADEMARK OFFICE
CERTIFICATE OF CORRECTION

PATENT NO. : 5,359,627
DATED : October 25, 1994
INVENTOR(S) : Howard L. Resnikoff It is certified that error appears in the above-indentified patent and that said Letters Patent is hereby corrected as shown below:

Column 17, line 51, delete "lo".

Column 18, line 19, delete " $\stackrel{\leq}{=}$ " and insert therefor -- $\leq$ --.

Column 18, line 19, delete "|µ" and insert therefor --|µ|--.

Column 18, line 46, delete "$^{(j=k)}$" and insert therefor --$^{(j+k)}$--.

Column 18, line 48, delete all occurrences of " $\stackrel{\leq}{=}$ " with -- $\leq$ --.

Column 19, line 4, delete "g>2" and insert therefor --µ>2--.

Column 20, line 6, delete "flat".

Column 20, line 9, delete "L $\stackrel{\geq}{=}$ 2" and insert therefor --L $\geq$ 2--.

Column 20, line 54, delete "L $\stackrel{\geq}{=}$ 2" and insert therefor --L $\geq$ 2--.

Column 20, lines 59-61, delete "each said numerical value having one of two possible values" and insert therefor --wherein each of said numerical values may be written in the form a+b $f_i$ , where a and b are constants having the same values for all said numerical values, and $f_i$ is a complex number having an absolute value of one and which may differ for different elements of said array.--.

UNITED STATES PATENT AND TRADEMARK OFFICE
CERTIFICATE OF CORRECTION

PATENT NO. : 5,359,627
DATED : October 25, 1994
INVENTOR(S) : Howard L. Resnikoff It is certified that error appears in the above-indentified patent and that said Letters Patent is hereby corrected as shown below:

Column 11, line 21, delete "ever" and insert therefor --every--.
Column 20, line 17, before "said" delete "a".
Column 22, line 4, before "said" delete "a".

Signed and Sealed this

Thirtieth Day of May, 1995

Attest:

BRUCE LEHMAN

*Attesting Officer*   *Commissioner of Patents and Trademarks*